United States Patent [19]

Lewis

[11] Patent Number: 5,546,223
[45] Date of Patent: Aug. 13, 1996

[54] METHOD FOR EXTERNAL EXCITATION OF SUBWAVELENGTH LIGHT SOURCES THAT IS INTEGRATED INTO FEEDBACK METHODOLOGIES

[76] Inventor: Aaron Lewis, Neve Shanan, 18/14 Jerusalem, Israel

[21] Appl. No.: 840,892

[22] Filed: Feb. 26, 1992

[30] Foreign Application Priority Data

Feb. 26, 1991 [IL] Israel .................................. 9732

[51] Int. Cl.⁶ .................................. G02B 21/06
[52] U.S. Cl. .................. 359/385; 359/368; 250/227.26
[58] Field of Search ................... 359/368, 385, 359/369, 389; 250/306, 307, 216, 227.11, 227.26; 356/301, 317, 338, 376

[56] References Cited

U.S. PATENT DOCUMENTS

| | | | |
|---|---|---|---|
| 4,604,520 | 8/1986 | Pohl . | |
| 4,659,429 | 4/1987 | Isaacson et al. | 359/368 |
| 4,662,747 | 5/1987 | Isaacson et al. | 359/368 |
| 4,725,727 | 2/1988 | Harder et al. . | |
| 4,880,496 | 11/1989 | Nebenzahl et al. | 359/368 |
| 4,917,462 | 12/1990 | Lewis et al. | 359/368 |
| 4,947,034 | 8/1990 | Wickramasinghe et al. | 250/216 |
| 5,018,865 | 5/1991 | Ferrell et al. | 356/376 |
| 5,105,305 | 4/1992 | Betzig et al. | 359/368 |
| 5,148,307 | 9/1992 | Kopelman et al. | 359/385 |
| 5,254,854 | 10/1993 | Betzig | 250/234 |
| 5,264,698 | 11/1993 | Kopelman et al. | 250/307 |
| 5,272,330 | 12/1993 | Betzig et al. | 250/216 |
| 5,286,970 | 2/1994 | Betzig et al. | 250/227.26 |
| 5,286,971 | 2/1994 | Betzig et al. | 250/227.26 |
| 5,288,996 | 2/1994 | Betzig et al. | 250/227.26 |
| 5,288,997 | 2/1994 | Betzig et al. | 250/227.26 |
| 5,288,998 | 2/1994 | Betzig et al. | 250/227.26 |
| 5,288,999 | 2/1994 | Betzig et al. | 250/227.26 |

OTHER PUBLICATIONS

"Development of High–Resolution Optical Scanning Fluorescence Microscopy" Satoshi Okazaki et al *Mikrochimica Acta* [Wien] 1988, III, 87–95.

"Scanning Tunneling Optical Microscopy" D. Courjon, K. Sarayeddine and M. Spajer, Optics Communication vol. 71, No. 1,2 1 May 1989.

"A Light Source Smaller Than the Optical Wavelength", K. Lieberman, S. Harush, A. Lewis, and R. Kopelman *Science*, 5 Jan. 1989, vol. 247, pp. 59–61.

"Development of A 500 Spatial Resolution Light Microscope" A. Lewis, M. Isaacson, A. Harootunian and A. Muray *Ultramicroscopy* 13 (1984) 227–232.

"Super–resolution Fluorescence Near–field Scanning Optical Microscopy" A. Harootunian, E. Betzig, M. Isaacson and A. Lewis Appl. Phys. Lett. 49 (11), 15 Sep. 1986 pp. 674–676.

"New Form of Scanning Optical Microscopy", R. C. Reddick, R. J. Warmack, and T. L. Ferrell *Physical Review B* vol. 39, No. 1, 1 Jan. 1989 pp. 767–770.

"Optical Stethoscopy: Image Recording with Resolution λ" 20 D. W. Pohl, W. Denk, and M. Lanz Appl. Phys. Lett. 44 (7), 1 Apr. 1984 pp. 651–653.

"Near–field Optical–scanning Microscopy", U. Durig, D. W. Pohl, and F. Rohner J. Appl. Phys. 59 (10), 15 May 1986, pp. 3318–3327.

"Optical Characteristics of 0.1μm Circular Apertures in a Metal Film as Light Sources for Scanning Ultramicroscopy" J. Vac. Sci. Technol. B 3(1), Jan./Feb. 1985 pp. 386–389.

*Primary Examiner*—Thong Q. Nguyen
*Attorney, Agent, or Firm*—Jones, Tullar & Cooper, P.C.

[57] ABSTRACT

Methods of externally exciting a subwavelength source includes illuminating with a first wavelength of light a material capable of excitation to produce a second wavelength of light, the material being mounted in an aperture movable with respect to a sample. The second wavelength light illuminates the sample, which is in the near field of the material producing the second wavelength light. The method further includes moving the material with respect to the sample, and sensing forces produced between the impinging second wavelength light and the sample for near field optical microscopy. Alternatively, the location of the material with respect to the sample is controlled, as for optical lithography.

32 Claims, 2 Drawing Sheets

METHOD FOR EXTERNAL EXCITATION OF SUBWAVELENGTH LIGHT SOURCES THAT IS INTEGRATED INTO FEEDBACK METHODOLOGIES

FIELD OF INVENTION

The field of the invention is a methodology for exciting externally a source, that is much smaller than the wavelength of the light that is being produced by this source and using this source for imaging with near-field and molecular exciton microscopy and for lithography in a manner that can be readily integrated into schemes for the control of the distance between the point source and the surface in a controlled fashion.

BACKGROUND OF THE INVENTION

Imaging with near field microscopy is discussed in A. Lewis, M. Isaacson, A. Harootunian and E. Muray, Ultramicroscopy 13 227 (1984); A. Harootunian, E. Betzig, M. Isaacson and A. Lewis, Appl. Phys. Lett. 49, 674 (1986); R.C. Reddick, R.J. Warmack and T.L. Ferrell, Phys. Rev. B, 39, 767 (1989); D.W. Pohl, W. Denk and M. Lanz, Appl. Phys. Lett., 44, 651 (1984); U. Durig, D. Pohl and F. Rohner, J. Appl. Phys. 59, 3318 (1986); U. Ch. Fischer, J. Vac. Sci. Technol. B3, 366 (1985); S. Okazaki, H. Sasatani, H. Hatano, T. Hayashi and T. Nagamura, Mikrochim. Acta (Wien), III 87 (1988); and D. Courjan, K. Sarayeddine, M. Spayer, Opt. Commun. 71, 23 (1989). Molecular exciton microscopy is discussed in K. Lieberman, S. Haroush, A. Lewis and R. Kopelman, Science, 247 59 (1990).

For the past several years there has been an increasing interest in developing a lensless methodology of light microscopy and lithography in which a small beam of light is scanned over a surface and either measures the optical properties of a surface as a function of the position of this beam of light, or patterns a surface, with resolutions that depend on the dimension of the point of light rather than the wavelength of the light. There have been basically two problems with this methodology of super-resolution light microscopy and lithography. The first problem involved trying to produce a point of light that was much smaller than a wavelength and still had enough intensity to produce images of low contrast objects by serially accumulating point by point information on the surface of an object. The second problem was a problem of feedback control, for it was difficult in a general fashion to control the distance between the point of light and the surface to be imaged. This distance is critical to the resolution that can be achieved in this lensless method of microscopy. This arises from the fact that in order to produce such serial images at a resolution that is much smaller than the wavelength of the light, the distance between the point of light and the surface has to be accurately controlled. In fact, the point source of light has to be within a distance known as the near-field, which is smaller than the wavelength of the light being used for the imaging. In other words, there has to be a method of feedback that maintains the point of light at a set distance from the surface.

In terms of the methodology of producing the point source of light, there were several stages in the development that have led to the ability to produce subwavelength spots of light. The history of these methodologies can be described in the following way. First, methodologies were found to produce small holes in a flat metal plate and light had to be passed through these small holes. It was seen from these experiments that light could be passed through holes that were smaller than 1/20 the size of the wavelength of the light. However, this methodology of producing spots of light smaller than the wavelength was not effective in producing a microscope since it was difficult to place such a point source in a flat plate relative to the surface in the near-field. In addition to this approach there was a methodology that allowed a point of subwavelength light to be generated at the tip of a long rod. There were generally two methods to this approach for producing of subwavelength spots of light. The first of these used a single crystal quartz etched to a tip and then coated with metal. Subsequently a small aperture was produced at the tip, which aperture appeared to be less than the wavelength of visible light (500 nm). Within this general method can also be categorized the use of solid optical fibers in which are created a subwavelength tip. All of these methods can be classified as prior knowledge based on the work of Synge (E.H. Synge, Phil. Mag. 6, 356 (1928).

An alternate approach was to heat and pull a hollow glass capillary into a pipette and produce an aperture at the tip which was smaller than the wavelength of light. This successfully allowed the production of small tips that could, under the right conditions, be as small as 7.5 nm. The problem with both of these approaches was that as the aperture got smaller, the throughput of the light became very low. This was also the problem with approaches using solid glass tapered structures. Nonetheless, the methodology of pipette formation allowed an alternate procedure to increase the throughput of the light passing through the hole. This approach involved the growing of small crystals that allowed the photons of light to be packed at the tip of the pipette as excitons passed through a region of the pipette that was below the cut-off frequency of the light. Experiments with this method indicated that, compared to an empty pipette without a crystal at the tip, one could get an amplification of two to ten times the intensity of light that could be passed through an empty pipette. In the present invention we describe a method that solves both the problems of feedback and of the intensity of the sub-wavelength light source.

STATE OF PRIOR ART

Based on the ideas described above several workers were able to produce and to patent devices and methodologies that permitted the generation of holes smaller than the wavelength of light that apertured a large light source such as a laser or a xenon lamp. In addition, workers were also able to produce crystal tipped pipettes where the excitation by the laser through the pipette allowed for exciton formation and these excitons increased the throughput of photons passing through a subwavelength aperture. However, in none of the previous art was there a description of how one might excite a subwavelength point of light by a second source of light that was not guided to ever smaller dimensions through a tapered tube until it reached the crystal or the aperture producing the subwavelength point source. In this invention there is described such a method of external illumination of a subwavelength light source that is readily integrated to a methodology of feedback control that allows the point source to be moved at a constant distance relative to the surface.

SUMMARY OF THE INVENTION

In accordance with the present invention, a method and a device for illumination of a point, subwavelength source of light are disclosed. The point source is illuminated without having to guide the larger exciting light to the point source by a tapered tube such as a fiber or pipette. Such illumination is readily coupled to a general feedback methodology for monitoring the force from a surface and thus resolves two of the principal problems in near-field microscopy which are the intensity of the subwavelength source and a method to control the distance between the surface and the point source. The method and the device can either be used together or together with designs that include one of the other accepted aperture based methods in near-field optics.

Broadly, the method of the present invention utilizes a large, intense light source which produces light at a first wavelength. This first light is directed onto a material which is responsive to that light to produce light at a different, or second, wavelength. The light-responsive material is contained in the subwavelength opening at the tip of a device such as a metallized pipette, so that the pipette tip acts as an aperture for the light emitted by the material. By placing the light-emitting material at the end of the pipette and stimulating the material from an external light source, it is not necessary to guide the longer-wavelength exciting light through a tube or fiber until it reaches the confined space of the receptacle holding the light-producing material. Because of the difference in the wavelengths of the exciting light source and the subwavelength light source, light from the two sources can be differentiated in an optical element such as a dichroic mirror, thereby allowing the excitation light to be reflected onto the light producing material, while allowing the emitted light to pass through the mirror.

The subwavelength light source acts as a point source, and can be mounted on a variety of receptacles other than a pipette, if desired. For example, the point source receptacle can be a silicon cantilever arm with a tip shaped to receive the light emitting material. The silicon cantilever arm can incorporate suitable electrodes to allow it to be used as a detector for light reflected from or emitted by a sample in response to light produced by the point source material.

The subwavelength light source material can be any material which responds to light stimulation at a first wavelength to produce light at a second wavelength. Thus, for example, the material can respond to two photon excitation or up-conversion to produce light at a shorter wavelength than the exciting light.

There are many materials that can fulfill the requirements of the subwavelength light source material. In the case of the material fluorescing with single photon excitation the substance could be for example pyrelene. In the case of two photon excitation, the material could be one of hundreds of dyes. An example of one such commercially available very common dye that goes under the name of Hoechst 33258. In the case of up-conversion the material could be urea or even the tip of an optical fiber that can be holographically transformed to give second harmonic light at a shorter wavelength than the incident laser beam. In some cases to stabilize the material from the incident laser light the dye can be embedded in a plastic or sol gel glass that is grown in the pipette tip and this is especially useful in the case of fluorescent materials such as pyrelene.

In one application of the present invention, the material in the subwavelength receptacle can serve as a light detector, responding to excitation light which is first reflected from a sample surface (or emitted by the sample surface) to provide a measure of the surface properties. In one application of this, the subwavelength material is mounted in one barrel of a double barreled pipette. The second barrel of this double-barreled pipette may then be used to measure conductance changes as the tips of the double-barreled pipette approach a sample surface. This conductance measurement acts as a distance feedback to determine the distance between the pipette tips and the sample surface.

Another feedback method utilized in the present invention for determining and for controlling the distance between the subwavelength light source and the surface of a sample is the force produced on the very small tip of a bent pipette by the proximity of a surface. This force is detectable as a deflection of the pipette tip and subsequently the cantilever which can be measured either interferometrically or by using a position sensitive detector technique that is standard in such force measurements. This technique is also applicable to straight pipettes which are perpendicular to the surface. In such a case, the sample is moved laterally relative to the pipette tip. The tip responds to this sample movement, and the resulting movement of the tip is measured interferometrically.

The tip of the pipette may be a sol gel glass that is porous and which contains an appropriate material as described above which is responsive to excitation at a first wavelength to produce light at a second wavelength. The excitation may be pulsed or continuous light.

In another application of the invention, the light produced by the subwavelength material has extremely small dimensions, and thus can be used to write lithographic patterns of high resolution on a surface.

The near-field microscopy techniques of the present invention can be incorporated in a conventional light microscope to add near-field capability to the far-field measurements of such microscopes, thereby greatly expanding the range of magnification of the combined microscope.

BRIEF DESCRIPTION OF THE DRAWINGS

The foregoing, and additional objects, features and advantages of the present invention will become apparent to those of skill in the art from the following detailed description of preferred embodiments thereof, taken with the accompanying drawings, in which.

DESCRIPTION OF THE INVENTION

Figure 1:
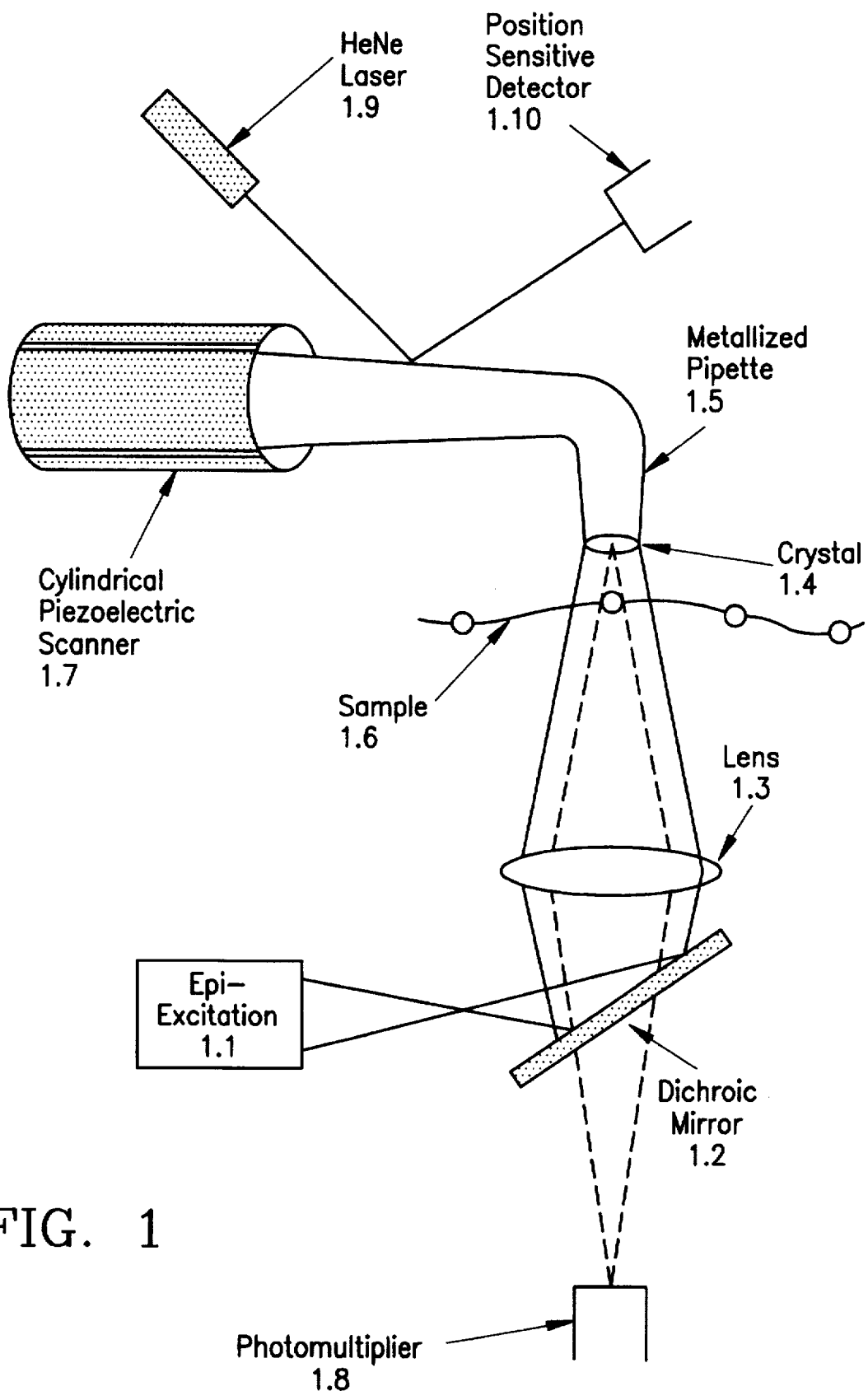
FIG. 1 is a diagrammatic representation of an embodiment of the invention wherein light from a large exciting source excites a subwavelength light source externally through a transparent sample.

The essence of the invention, in terms of microscopy, is the use of an optical element such as a dichroic mirror or other appropriate optical elements that, in combination with a material for the subwavelength light source, produces light at a wavelength that is different than the excitation wavelength of the larger light source. If the wavelength of the subwavelength light source is longer than that of the larger diameter exciting light, then in one embodiment of the invention a dichroic mirror is used to reflect the larger excitation source's radiation. The dichroic mirror also transmits the light from the subwavelength light source after it has interacted with the surface that is to be interrogated. An example of this approach to near-field microscopy is seen in FIG. 1. In this figure an inverted microscope is employed with epi-illumination, although similar arrangements can be used with any microscope. The larger light source 1.1 is reflected off the dichroic mirror 1.2 and is focused by lens 1.3 onto the front face of a subwavelength aperture in which a material, which in this case is a crystal 1.4 of, for example, anthracene/tetracene, is deposited. The crystal is activated by the impinging light and acts as a. point source, producing light by, for example, emission which is at a wavelength that is different than that of the incident light.

The point source of light in this case is in a subwavelength aperture at the tip of a metallized pipette 1.5 that is bent. The bent pipette allows implementation of one generally acceptable method of force sensing with the pipette.

Such force sensing is a general method of feedback for keeping the point source within the near-field. The method described here can also be used with other force sensors and force sensing methods. One such sensor uses microfabricated silicon cantilevers with holes that can contain the light emitting material that forms the subwavelength source. An alternate method of force sensing is based on the use of a lateral force in which a sample is moved with an appropriate modulation frequency and the deflection of a bent or straight pipette is detected interferometrically in order to sense the distance from the pipette tip to the surface. In all such cases, the point source is scanned across a surface of a sample 1.6 by means of a piezoelectric device such as scanner 1.7, whereby the light from the subwavelength source 1.4 interrogates the sample. The light from source 1.4 which passes through the sample in this epi-illumination mode is then focused by the same lens 1.3 that focused the larger light source and is transmitted by the dichroic mirror 1.2 to a detector such as a photomultiplier 1.8. In this embodiment, the effect of the force of the surface is monitored by bouncing a helium-neon laser 1.9 off the cantilever and onto a position sensitive detector 1.10. (P. Hansma, Physics Today, October 1990).

Figure 2:
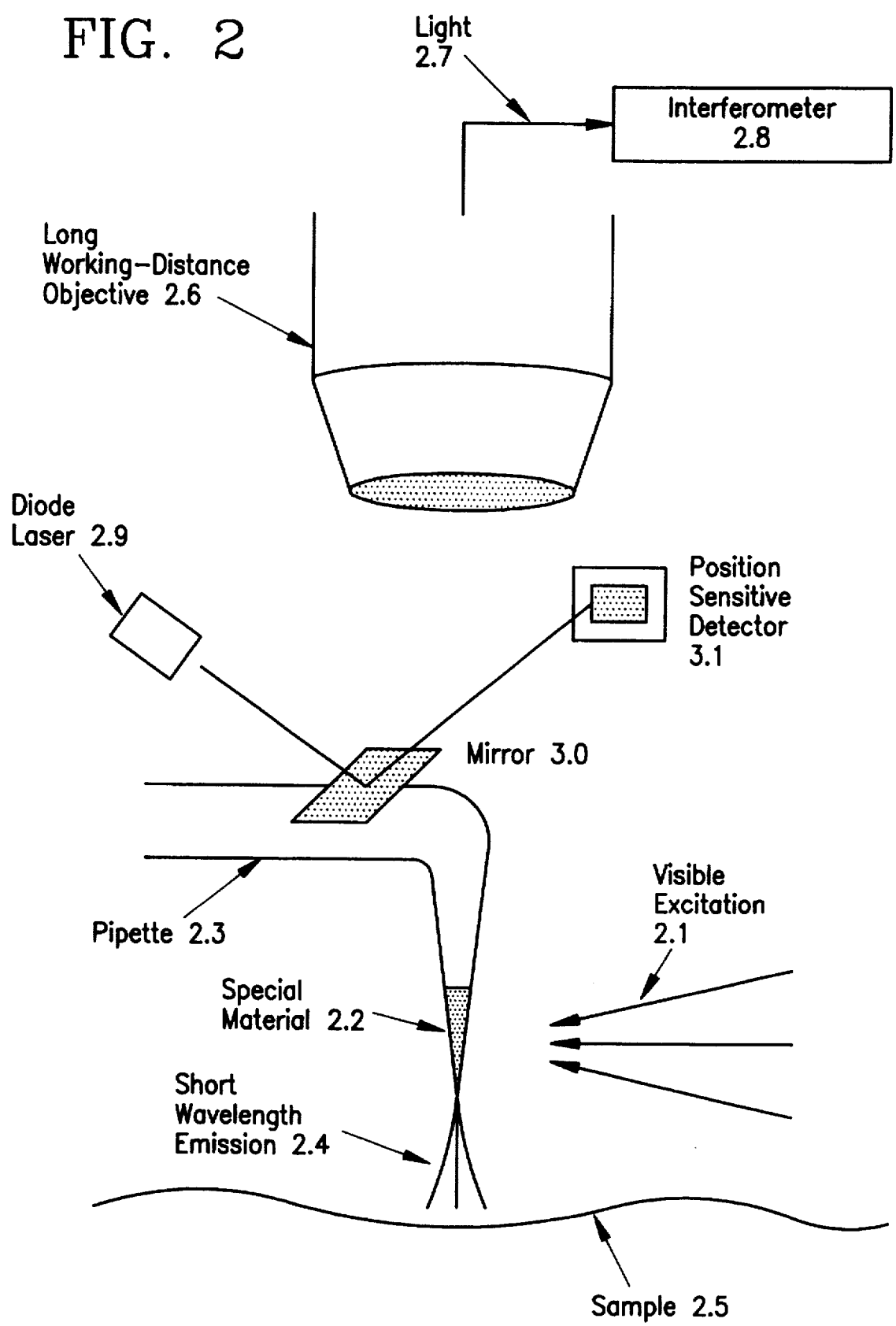
FIG. 2 is a diagrammatic representation of one embodiment of the invention wherein light from a large exciting source excites a subwavelength light source externally when the sample is opaque.

The light source of this invention may also be used in high resolution lithography, as is diagrammatically illustrated in FIG. 2. The embodiment of lithography with external illumination utilizes a method that is also applicable to reflection microscopy and alternate methods of force sensing other than the position sensitive measurement used in the above embodiment of microscopy. In this case external illumination which may be visible light from a source 2.1 such as a pulsed laser can produce high efficiency two photon excitation or frequency up-conversion in a material 2.2 which is a light emitting material carried in the end of a pipette 2.3. This material can even be solid glass, for example. The material acts as a point source to produce a short wavelength emission of light 2.4 which can interrogate a sample 2.5 for microscopic applications or write a lithographic pattern on the surface of the sample. The light for the microscopic applications is collected by an objective lens 2.6 and is supplied to a sensor (not shown). This same lens 2.6 can also be used to collect light 2.7 from the pipette surface and this collected light can be supplied to an interferometer 28 to interferometrically detect movements in the pipette as it senses the force of the surface, either directly or by laterally moving the sample relative to the pipette tip.

This same method of external excitation of the light source together with the excellent force characteristics of the pipette, as shown by the experiments completed as a part of this invention, can be used with a position sensitive method of force sensing using a diode laser source 2.9 directing light onto a mirror 3.0, which in turn reflects this light onto a position sensitive detector 3.1. Alternatively, a straight pipette and an interferometric method of lateral force sensing can be used. In this case, the lens or a light transmitting fiber, is positioned perpendicular to the present position of the lens 2.6, focusing and collecting the force detecting light on the side of the pipette.

In essence the present integration of force sensing with near-field optics is applicable in all forms of near-field light microscopy, including molecular exciton microscopy and near-field lithography. In addition, the method of the invention produces large amounts of photons and/or excitons in dimensions that even approach single molecules. Accordingly, it is expected that this will allow for a significant improvement in the signal to noise in these important new forms of light microscopy and lithography.

EXPERIMENTS

Large intensities of light have been observed from the tip of a pipette that has been externally illuminated in the manner described above in the Description of the Invention. It has also been found possible to bend the tip of the pipette (A. Lewis and K. Lieberman, Analytical Chemistry 63, 625A (1991)). In addition, the force characteristics of pipettes have been measured, and such measurements show that the pipettes can readily achieve force constants of 10 N/m. It is anticipated that a reduction in this force constant by two orders of magnitude can be achieved. Such probes can be produced simply with a variety of geometries that permit a wide range of force imaging requirements to be met.

ADVANTAGES

The great advantage of this method is that the ultimate resolution of this approach to this wavelength independent form of microscopy will be tens of times better than the wavelength of the light employed for the imaging. This is based on several factors. First, the contrast of the pipette light source itself will be improved by this illumination method because under normal illumination through pipettes smaller than 50 nm the contrast between the metal and the hole becomes vanishingly small due to the finite conductivity of the metal. In the present case, since minimal evanescent propagation is required, the point source at the end of the pipette remains well defined even for small diameter pipettes. In fact the definition may improve as a result of fluorescence quenching due to the metal surrounding the aperture containing the fluorescent source and the fact that an additional contrast enhancement is obtained by passing light twice through the metal coating. Second, the intensity of the light source decreases as a function of area of the emitting point rather than the conventional exponential decrease that is characteristic of such subwavelength, lensless approaches. Third, to obtain the ultimate in resolution there is little doubt that a method of regulation of the distance from the light effusing tip to the sample surface is essential. The method described herein is readily integratable with a number of possible methods of feedback regulation. The present invention specifically focuses on the first method that permits force sensing to be integrated into a near-field optics probe. In essence, the invention realizes that tapered glass structures, especially a pipette, have ideal force constants and thus can be used for force sensing measurements with cantilever based approaches or with straight pipettes and using lateral force methods. This invention utilizes an integrated approach for nearfield lensless microscopy and lithography with force sensing and with full integration into far-field light microscopy. This was not previously attainable, and has important applications in a number of fields including biology, for it is well known in biology that small metal spheres can be attached to specific biological molecules and these spheres will be excellent non-fluorescent absorbers, very good scatterers and quenchers for the subwavelength light source. This provides for exceptional contrast enhancement in transmission or reflection microscopy.

The diagrammatic representation in FIG. 1 of one embodiment of the method that allows differentiation of light from a large exciting light source that excites a subwavelength light source externally illustrates the ease with which the method can be incorporated into general force feedback schemes. In essence this integrates for the first time any force method of feedback with a near-field optical probe. In addition the illumination approach allows many force feedback probes to now be used with near-field optics.

The diagrammatic representation in FIG. 2 of one embodiment of the method that allows external excitation for lithography is an example of a method of excitation which includes two photon excitation and/or up-conversion with appropriate materials and light sources. The method can also be applied to reflection microscopy with the appropriate filter placed before the detector in order to differentiate the excitation from the emitted light. As in FIG. 1, a method of force sensing is clearly demonstrated with a near-field optical tip. The deflections of this tip by the force of the sample can be measured either interferometrically through the lens or with the position sensitive detector shown. Such measurements can be used with either standard force sensing approaches that include touch, with tip modulation or with sample modulation. In addition, the structure of the glass pipette can be either bent or straight, with the bent pipette allowing for the lens to be placed as shown and the straight pipette requiring the lens or a fiber to be placed ninety degrees to the present position of the lens, and interferometric methods to be used with lateral force to detect surface forces with the pipette.

What is claimed is:

1. A method of external excitation of subwavelength light source, comprising:
   mounting a material capable of excitation to produce light in a subwavelength aperture;
   directing light from a source external of said aperture at a first wavelength onto said material to excite said material to produce point source light at a second wavelength; and
   directing said second wavelength light to a sample having a surface in a near field of said subwavelength source.

2. The method of claim 1, wherein the step of directing light from an external source comprises emitting said first wavelength light from said surface.

3. The method of claim 1, wherein the step of directing light from an external source comprises directing said first wavelength light along said surface.

4. The method of claim 1, wherein the step of mounting a material in a subwavelength aperture includes mounting said material in a tip of a moveable pipette; and
   further including detecting motion of said pipette to measure the distance between said tip and said surface.

5. The method of claim 1, further including controlling said aperture with respect to said surface to write lighographic patterns on said surface.

6. The method of claim 1, further including controlling the position of said aperture with respect to said surface for detecting variations in near-field optical properties of the surface.

7. A method of external excitation of a subwavelength light source, comprising:
   mounting a material capable of excitation to produce light in a subwavelength aperture;
   directing light from an external source at a first wavelength onto said material by propagating said first wavelength light along sample surface;
   selectively moving said subwavelength aperture into said first wavelength light to excite said material to produce a point source of light at a second wavelength; and
   directing said second wavelength light to a surface of said sample in the near field of said second wavelength point source.

8. The method of claim 7, further including detecting the distance between said aperture and said surface.

9. The method of claim 8, further including controlling said distance to selectively move said aperture with respect to said surface to maintain the surface in the near field of said point source.

10. The method of claim 9, wherein the step of detecting the distance between said aperture and said surface includes measuring a force exerted on said aperture by said surface.

11. The method of claim 9, wherein the step of detecting the distance between said aperture and said surface includes measuring light conductance therebetween.

12. The method of claim 8, wherein the step of detecting the distance between said aperture and said surface includes forming said aperture on a free end of a cantilever force sensor and detecting motion of said cantilever free end due to forces between said free end and said surface.

13. A method of external excitation of a subwavelength light source, comprising:
   mounting a material capable of excitation to produce light in a subwavelength aperture;
   directing light to said material from an external source at a first wavelength along a first path including a sample to excite said material to produce point source light at a second wavelength;
   directing said second wavelength light to a surface of said sample in the near field of said subwavelength source; and
   further directing said second wavelength light through said sample along at least a part of said first path to a light sensor for detecting light produced by said material in said subwavelength aperture.

14. The method of claim 13, further including:
   detecting the distance between said subwavelength aperture and said surface; and
   controlling said distance to maintain said surface in the near field of said point source light produced by said material.

15. The method of claim 14, wherein the step of detecting the distance between said aperture and said surface includes measuring a force exerted on said aperture by said surface.

16. The method of claim 14, wherein the step of detecting the distance between said aperture and said surface includes measuring conductance therebetween.

17. The method of claim 13, further including:
   optically differentiating said light of said first and second wavelengths in said first path.

18. The method of claim 13, wherein the step of mounting a material capable of excitation includes mounting a two-photon light-producing material, said first wavelength light producing two-photon excitation in said material to produce said point source light at a shorter wavelength than that of said first wavelength light.

19. A method of external excitation of a subwavelength light source, comprising:

mounting a material capable of excitation to produce light in a subwavelength aperture;

directing light from an external source at a first wavelength along a first path to excite said material to produce a point source of light at a second wavelength;

directing said second wavelength light to a surface of a sample in the near field of said second wavelength light; and further directing said second wavelength light through said sample to a light sensor for detecting light produced by said material in said subwavelength aperture.

20. The method of claim 19, further including:

detecting the distance between the subwavelength aperture and said sample surface.

21. The method of claim 20, wherein the step of detecting distance includes measuring the force exerted on said aperture by said surface.

22. The method of claim 20, wherein the step of detecting distance includes measuring the light conductance therebetween.

23. The method of claim 19, wherein the step of mounting a material includes mounting a two-photon light-producing material, said first wavelength light producing two-photo excitation in said material.

24. The method of claim 19, wherein the step of directing said light of a first wavelength includes emitting said first wavelength light from said surface.

25. The method of claim 19, wherein the step of directing said light of a first wavelength includes directing said first wavelength light long said surface.

26. The method of claim 19, wherein the step of mounting said material includes mounting the material in a tip of a movable pipette; and p1 further including measuring motion of said pipette to determine the distance between the tip and the surface.

27. The method of claim 19, further including controlling of said aperture with respect to said surface to write lithographic patterns on said surface.

28. The method of claim 19 further including controlling the position of said aperture with respect to said surface for detecting variations in near-field properties of said surface.

29. A method of external excitation of a subwavelength light source, comprising the steps of: p1 providing a material capable of excitation by light of a first wavelength to produce a point source of light of a second wavelength, said material having a physical dimension smaller than said second wavelength; p1 directing light of said first wavelength from an external source spaced from said material by way of a sample to excite said material and to produce said point source light of said second wavelength; and p1 detecting said light of said second wavelength to determine characteristics of said sample.

30. The method of claim 29, wherein directing light by way of a sample includes directing light of said first wavelength through said sample.

31. The method of claim 29, wherein directing light by way of a sample includes causing said light of said first wavelength to be reflected from a surface of said sample.

32. The method of claim 29, wherein directing light by way of a sample includes directing said light of said first wavelength along a surface of said sample.

* * * * *

UNITED STATES PATENT AND TRADEMARK OFFICE
CERTIFICATE OF CORRECTION

PATENT NO. : 5,546,223
DATED : August 13, 1996
INVENTOR(S) : Aaron LEWIS

It is certified that error appears in the above-indentified patent and that said Letters Patent is hereby corrected as shown below:

```
Claim 5, col. 7, line 2, "ligho" should be --litho--.
Claim 7, col. 8, line 7, after "along" insert --a--.
Claim 16, col. 8, line 3, after "measuring" insert --light--.
Claim 19, col. 9, line 10, after "light" insert --source--.
Claim 22, col. 9, line 1, after "detecting" insert --the--;
                 line 2, cancel "the".
Claim 23, col. 9, line 3, change "photo" to --photon--.
Claim 26, col. 10, line 3, cancel "pl".
Claim 27, col. 10, line 2, cancel "of".
Claim 29, col. 10, line 2, cancel "the steps of";
                 line 2, cancel "pl";
                 line 6, cancel "pl";
                 line 9, cancel "pl".
```

Signed and Sealed this

Twenty-sixth Day of November 1996

*Attest:*

BRUCE LEHMAN

*Attesting Officer*     Commissioner of Patents and Trademarks